United States Patent [19]

Kaneta et al.

[11] Patent Number: 4,717,257
[45] Date of Patent: Jan. 5, 1988

[54] ALIGNMENT DEVICE

[75] Inventors: Minoru Kaneta, Tokyo; Ichiro Ishiyama, Kawasaki, both of Japan

[73] Assignee: Canon Kabushiki Kaisha, Tokyo, Japan

[21] Appl. No.: 763,710

[22] Filed: Aug. 8, 1985

[30] Foreign Application Priority Data

Aug. 13, 1984 [JP]  Japan ................................. 59-167780

[51] Int. Cl.⁴ ............................................. G01B 11/00
[52] U.S. Cl. ..................................... 356/400; 356/399
[58] Field of Search ......................... 356/400, 401, 399

[56] References Cited

U.S. PATENT DOCUMENTS

4,251,129 2/1981 Suzki et al. ........................... 356/401
4,538,914 9/1985 Yomoda et al. ..................... 356/401

Primary Examiner—R. A. Rosenberger
Assistant Examiner—Crystal D. Cooper
Attorney, Agent, or Firm—Fitzpatrick, Cella, Harper & Scinto

[57] ABSTRACT

An alignment device for aligning a reticle and a wafer with the aid of a projection lens system for projecting an integrated circuit pattern of the reticle onto the wafer, wherein a light beam from the wafer is passed throught the projection lens and is directed by way of an objective lens to a spatial filter to detect a positional relation between the reticle and the wafer. According to the position of an optical axis of the objective lens relative to an optical axis of the projection lens and according to the telecentricity of the projection lens, the spatial filter is displaced relative to the optical axis of the objective lens, whereby a particular component of the light beam from the wafer is positively extracted out, without being affected against by displacement of the objective lens for the alignment operation.

5 Claims, 7 Drawing Figures

ALIGNMENT DEVICE

FIELD OF THE INVENTION AND RELATED ART

This invention relates to an alignment device and, more particularly, to an alignment device usable in an apparatus for manufacturing semiconductor circuit devices, and for aligning a reticle or photomask with a wafer with the aid of an optical system for projecting a circuit pattern of the reticle or photomask onto the wafer.

In projection type exposure apparatuses for manufacturing semiconductor devices such as large scaled integrated circuits (LSIs), very large scaled integrated circuits (VLSIs), etc., a projection lens having a reduced imaging magnification of an order of 1/5–1/10 is usually employed to project, onto a semiconductor wafer, an integrated circuit pattern formed on a reticle or photomask (which hereinafter will be referred to simply as "reticle"). By alternately repeating movement of the wafer relative to the reticle pattern and exposure of the wafer to the reticle pattern, a number of reticle patterns are reproduced on the whole surface of the wafer.

In such types of exposure apparatuses, it is necessary to detect a positional relation between the reticle and the wafer and to bring them into alignment with each other, prior to each exposure, in order to assure that a reticle pattern, when it is projected onto the wafer by the projection lens, is accurately overlaid on the pattern or patterns which have already been transferred onto the wafer. To allow alignment between the reticle and the wafer, an alignment mark is formed on each of the reticle and the wafer. According to one of the known methods of detecting the position of such alignment mark, the alignment mark is irradiated by a light beam and such component of the light as is scatteringly reflected by edges of the alignment mark is separated, spatially, from such component of the light as is specularly reflected by the alignment mark area. Only the scatteringly reflected light component containing the positional information on the alignment mark is received by a photodetector, whereby the position of the alignment mark is detected. The separation of the scatteringly reflected light component from the specularly reflected light component is achieved, for example, by a spatial filter having a light transmitting area and a light intercepting area.

In general, the position of such alignment mark varies for different reticles having different patterns. That is, where different patterns of different reticles are superposingly transferred onto the same wafer, plural alignment marks are formed on the same wafer at different positions.

On the other hand, the projection lenses for the projection exposure apparatuses are generally classified into two types, i.e. a dual telecentric type showing telecentricity (telecentric characteristic) with respect to each of the object side (reticle side) and the image side (wafer side) and a single telecentric type showing telecentricity with respect to the image side (wafer side) only. Where a projection lens of dual telecentric type is employed, the principal ray of the light beam forming an image of the reticle is perpendicularly incident on the wafer surface and also the principal ray of the light beam reflected by the wafer surface toward the reticle surface is perpendicularly incident on the reticle surface. Such perpendicular incidence is assured for any image height, i.e. for any distance to the principal ray from the optical axis of the projection lens. Also in a case of the projection lens of single telecentric type, the principal ray is perpendicularly incident on the wafer surface irrespective of any image height. However, with the projection lens of single telecentric type, the principal ray of the light beam reflected by the wafer surface and passed through the projection lens is inclinedly incident on the reticle surface, if the point on the wafer surface from which the light beam is reflected toward the reticle is at a substantive image height position (i.e. an off-axis position deviated from the on-axis position with respect to the optical axis of the projection lens). The inclination of the incident principal ray varies with the change in the image height.

If, therefore, a projection lens of the single telecentric type is used and where the alignment system is arranged so as to detect an optical signal, corresponding to the wafer alignment mark, through the projection lens in order to detect the relative position of the reticle and the wafer, any change in position of the wafer alignment mark, namely a change in the image height, would lead to displacement of the position of incidence of the principal ray of the specularly reflected light component on a surface of the spatial filter for selecting the optical signal corresponding to the wafer alignment mark. This results in difficulties in achieving correct detection of the optical signal.

In a case where a projection lens of dual telecentric type is used and the optical signal corresponding to the wafer alignment mark is detected through the projection lens, and if the projection lens does not show complete telecentricity over the entire range of image height, due to any errors caused during manufacture thereof or the like, the change in the image height of the wafer alignment mark leads, also in the case, to displacement of the position of incidence of the principal ray of the specularly reflected light component on the surface of the filter means for selecting the optical signal corresponding to the wafer alignment mark, by an amount corresponding to the error in the telecentricity. The deviation of the position of incidence of the optical signal on the filter surface results in difficulties in achieving correct detection of the optical signal, as in the case of the single telecentric type projection lens.

Failure of correct detection of the optical signal from the wafer alignment mark makes difficult the high-accuracy alignment of the reticle and the wafer.

SUMMARY OF THE INVENTION

It is accordingly a primary object of the present invention to provide an alignment device by which a reticle and a wafer are aligned highly accurately with the aid of an optical system for projecting a pattern of the reticle onto the wafer.

Briefly, according to the present invention, there is provided an alignment device for aligning a reticle and a wafer with the aid of a projection lens system for projecting an integrated circuit pattern of the reticle onto the wafer, wherein a light beam from the wafer is passed through the projection lens and is directed by way of an objective lens to a spatial filter to detect a positional relation between the reticle and the wafer. According to the position of an optical axis of the objective lens relative to an optical axis of the projection lens, and according to the telecentricity of the projection lens, the spatial filter is displaced relative to the optical axis of the objective lens, whereby a particular component of the light beam from the wafer is positively extracted out, without being affected by displacement of the objective lens for the alignment operation.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Figure 1:
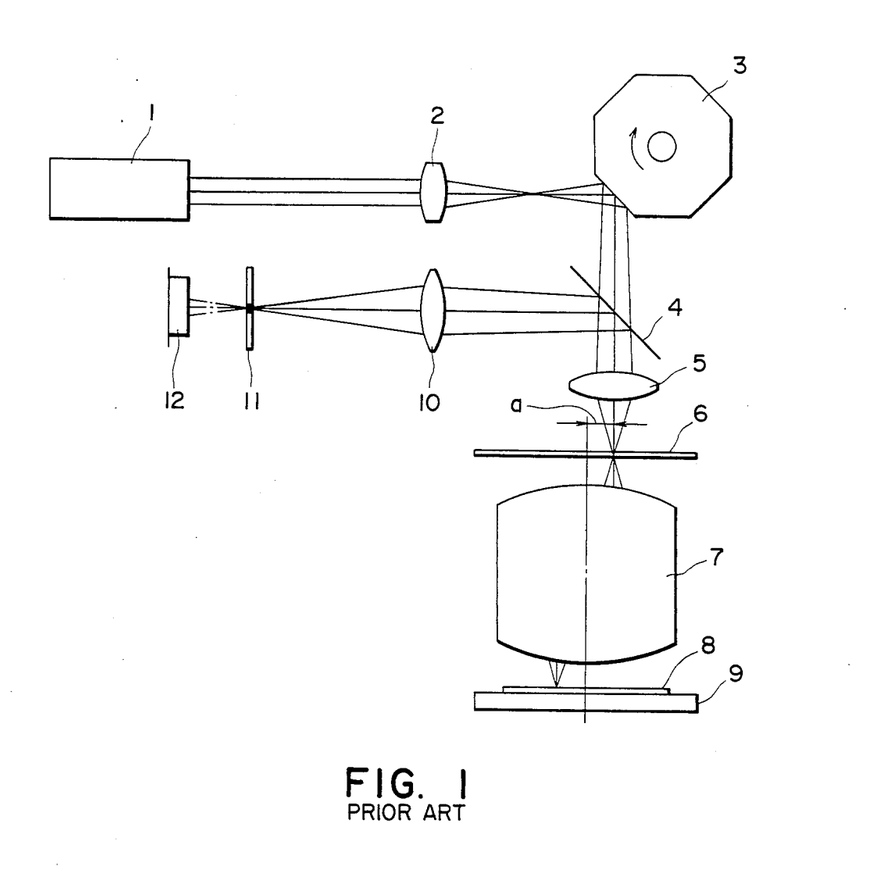
FIG. 1 is a schematic view showing an example of alignment system for aligning a reticle and a wafer in a projection exposure apparatus.

Referring first to FIG. 1, the principle of alignment of a reticle and a wafer in a projection exposure apparatus will now be described.

In the FIG. 1 example, the relative position of a reticle 6 and a wafer 8 is detected by detecting an optical signal from a reticle alignment mark formed on the reticle 6 and by detecting an optical signal from a wafer alignment mark formed on the wafer 8 through the projection lens 7 for projecting a circuit pattern of the reticle 6 onto the wafer 8. In the state of FIG. 1, the wafer alignment mark is formed on the wafer 8 at a position corresponding to an image height a and the principal ray of the specularly reflected light component from the wafer alignment mark area travels exactly along an optical axis of an alignment optical system.

A laser 1 produces a laser beam which passes through a lens 2 and, after being deflected by a polygonal mirror 3 rotating at a constant speed, passes through a half mirror 4 and through an objective lens 5, whereby it is focused on the reticle 6. The reticle 6 has formed thereon an alignment mark provided for the sake of alignment with the wafer 8. The laser beam passed through the reticle 6 enters into the projection lens 7 having a reduced magnification by which it is focused again on the wafer alignment mark area formed in a scribe line on the wafer 8 surface. The wafer 8 is carried by a carriage 9 which is movable in a plane perpendicular to the optical axis of the projection lens 7. The laser beam incident on the wafer alignment mark area is reflected by this area and the reflected laser beam, composed of a specularly reflected component and a scatteringly reflected component, namely an optical signal from the wafer alignment mark, passes again through the projection lens 7, the reticle 6 and the objective lens 5 so that it is incident on the half mirror 4. By this half mirror 4, the optical signal from the wafer alignment mark is directed along another path different from that along which the laser beam has been incident on the wafer 8 surface, so that it passes through a lens 10 and is incident on optical signal selecting means 11 such as, for example, a spatial filter provided to extract out a predetermined component of the reflected laser beam, more particularly the scatteringly reflected component of the laser beam in this embodiment, to detect the position of the wafer alignment mark. For this purpose, the optical signal selecting means of this embodiment is arranged to intercept the specularly reflected component of the laser beam reflected from the wafer 8 surface and to transmit the scatteringly reflected component thereof. The laser beam thus transmitted through the optical signal selecting means 11 is then incident on photoelectric converting means 12 such as a pin-photodiode for converting the light incident thereon into an electrical signal. Since the specularly reflected component from the wafer 8 surface is intercepted by the optical signal selecting means 11, it would not reach the photoelectric converting means 12. In this manner, the position of the wafer alignment mark on the wafer 8 surface is detected.

On the other hand, a portion of the laser beam emitted from the laser 1 and incident on the reticle 6 is directly reflected thereby and the thus reflected laser beam containing the positional information on the reticle alignment mark advances along its oncoming path. The scatteringly reflected component of the laser beam reflected by the reticle alignment mark is extracted in a similar manner and is directed by an unshown beam splitter to an unshown photodetector, whereby the position of the reticle alignment mark is detected in a similar manner. By electrically processing an output of the photoelectric converting means 12 and an output of the unshown photodetector means detecting the position of the reticle alignment mark, the relative position of the reticle 6 and the wafer 8 is detected. The principle of such position detection for the sake of alignment is disclosed, for example, in U.S. Pat. No. 4,251,129 issued Feb. 17, 1981.

Figure 2:
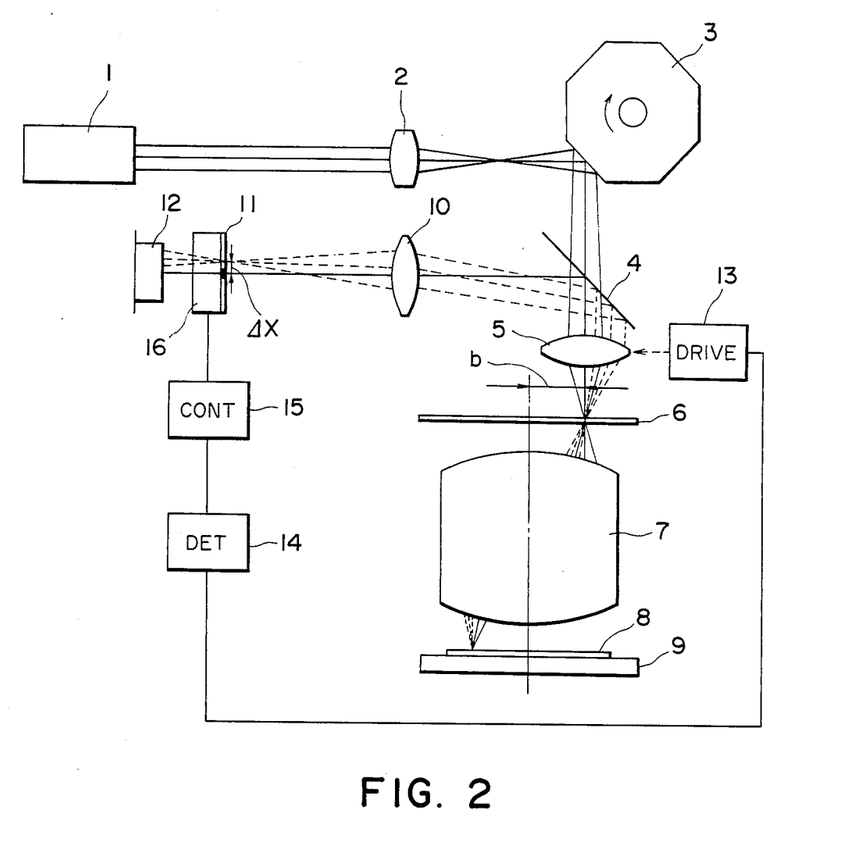
FIG. 2 is a schematic and diagrammatic view showing an alignment device according to an embodiment of the present invention.

Referring to FIG. 2, there is shown a projection exposure apparatus having an alignment device according to an embodiment of the present invention. The same reference numerals as in the FIG. 1 arrangement are assigned to elements having corresponding functions as of those in FIG. 1. In the FIG. 2 embodiment, the alignment device is arranged such that, when the optical axis of the alignment optical system is to be displaced relative to the optical axis of the projection optical system in order to meet the positional displacement of the alignment mark, the position of the optical signal selecting means 11 is automatically adjusted and moved to an optimum position in accordance with the telecentricity of the projection lens 7.

Where the wafer alignment mark is formed on the wafer 8 surface at a position corresponding to an image height b shown in FIG. 2 as compared with the position corresponding to the image height a (FIG. 1) at which the principal ray of the specularly reflected light component from the wafer alignment mark travels exactly along the optical axis of the alignment optical system as has been described with reference to FIG. 1, the position of incidence, on the surface of the optical signal selecting means 11, of the principal ray of the optical signal from the wafer alignment mark is displaced due to the characteristics of the projection lens 7, i.e. the single telecentric characteristic or any error of the telecentricity. As a result, the position on the surface of the optical signal selecting means 11 at which the specularly reflected light component from the wafer 8 surface is imaged is deviated by an amount ΔX, so that, without the present invention, such specularly reflected light component from the wafer 8 surface could not be completely intercepted by the optical signal selecting means 11. Consequently, without the present invention, the optical signal corresponding to such component of the laser beam that has been scatteringly reflected by the wafer alignment mark could not be detected correctly. This problem is solved by the present invention. That is, in accordance with the FIG. 2 embodiment of the present invention, the position of the optical signal selecting means 11 is automatically adjusted relative to the optical signal from the wafer alignment mark.

More specifically, if the optical axis of the alignment optical system is displaced relative to the optical axis of the projection optical system, namely, if the objective lens 5 is moved by an objective driving mechanism 13 in a plane perpendicular to the optical axis of the projection lens 7 in order that the alignment mark of the reticle 6 and the alignment mark of the wafer 8 are positioned within the viewfield of the objective lens 5, a detecting system 14 detects the newly established position of the optical axis of the objective lens 5 relative to the optical axis of the projection lens 7 on the basis of a number of pulses which have been applied to a pulse motor provided in the objective driving mechanism 13 for the movement of the objective lens 5. The thus obtained information on the relative position of the optical axes of the objective lens 5 and the projection lens 7 is applied to a controller 15 connected to the detecting system 14. In accordance with the information on the relative position of the optical axes of the objective lens 5 and the projection lens 7 and with the characteristics of the telecentricity of the projection lens 7 which have been preparatively stored therein, the controller 15 calculates the amount of deviation (ΔX) between the center of the optical signal selecting means 11 and the position of incidence, on the surface of the optical signal selecting means 11, of the principal ray of the specularly reflected light component from the wafer 8 surface. In accordance with the thus obtained deviation ΔX, the amount of drive of a position correcting mechanism 16 for moving the optical signal selecting means 11 is controlled, whereby the optical signal selecting means 11 is automatically moved to a position best suited for the characteristics of the telecentricity of the projection lens 7, i.e. to a position at which the optical signal selecting means 11 effectively selects or extracts only a particular component of the light, more particularly the scatteringly reflected light component from the wafer alignment mark. As a result, only the scatteringly reflected component is directed to the photoelectric converting means 12. In the event that the objective lens 5 is displaced, the optical path length between the polygonal mirror 3, the objective lens 5 and the signal selecting means 11 is corrected by an unshown correcting means so that the optical path length is maintained constant irrespective of movement of the objective lens 5.

Figure 3A:
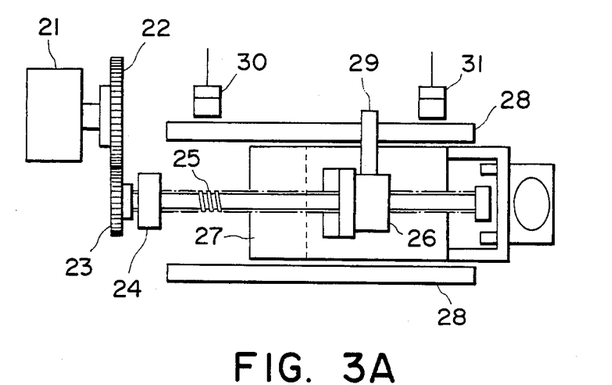
FIGS. 3A and 3B are views showing details of a driving system for an objective lens in an alignment device according to the embodiment of the present invention as shown in FIG. 2.
Figure 3B:
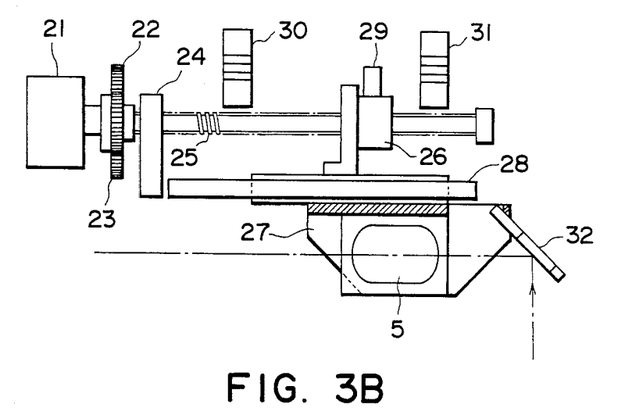

FIGS. 3A and 3B show details of the objective driving mechanism 13. As shown in the drawings, the mechanism includes a pulse motor 21 as aforesaid whose output is transmitted by way of a gear train 22 and 23 to a ball screw 25 rotatably supported by a housing 24. A nut 26 is, on one hand, fixedly secured to a holder 27 for holding the objective lens 5 and is, on the other hand, movable with the rotation of the ball screw 25. The holder 27 is supported by a guide rail 28 for movement in a direction perpendicular to the optical axis of the projection lens 7. The holder 27 is provided with a mirror 32 for deflecting, by a right angle, the optical axis of the objective lens 5. The mechanism further includes photosensors 30 and 31 for detecting, respectively, limits of movement of the holder 27. Each of the photosensors 30 and 31 is arranged to output a predetermined signal when its detecting beam is intercepted by a light-blocking plate 29 fixedly secured to a nut 26. In this manner, the limit positions for the movement of the holder 27 can be detected.

Figure 4A:
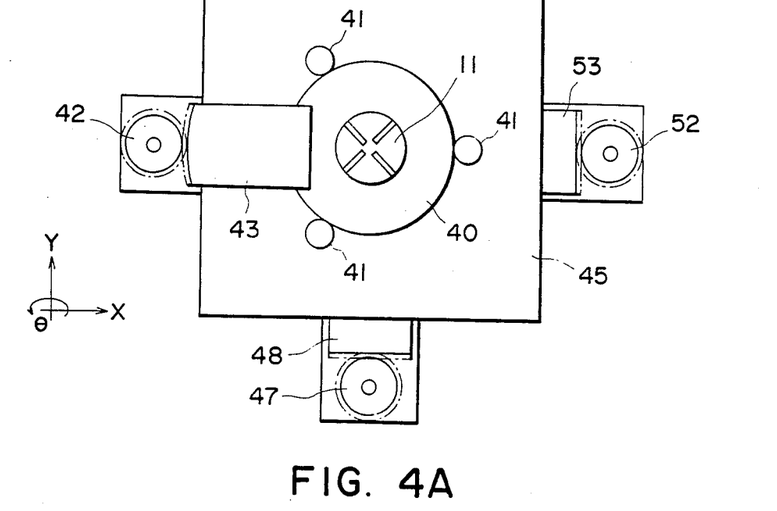
FIGS. 4A and 4B are views showing details of a position adjusting system for a spatial filter in an alignment device according to the embodiment of the present invention shown in FIG. 2.
Figure 4B:
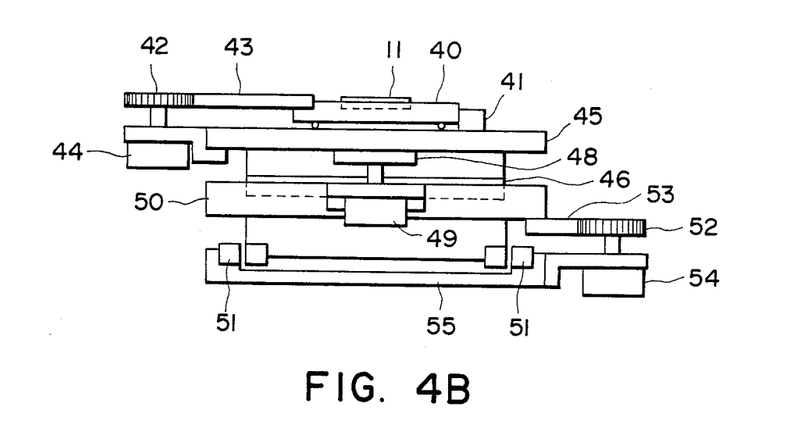

FIGS. 4A and 4B show details of the position correcting mechanism 16 for the optical signal selecting means 11. In this embodiment, the signal selecting means 11 comprises a spatial filter having elongating apertures extending in two orthogonal directions, as shown in FIG. 4A, provided for transmitting, e.g., only the scatteringly reflected component from the wafer alignment mark. The remaining area of the surface of the spatial filter defines a light-blocking portion. Particularly, in this embodiment, the central area of the light-blocking portion of the spatial filter is effective to intercept the specularly reflected component of the light reflected by the wafer surface. The signal selecting means 11 is fixedly supported by a θ-slider 40 which is rotatable in the direction of θ. The θ-slider 40 is supported by guides 41—41 for rotational movement about the optical axis of the objective lens 5. The θ-slider 40 is rotatively displaced by a pulse motor 44. The pulse motor 44 is supported by an X-slider 45 and the output of the pulse motor 44 is transmitted to the θ-slider 40 by means of a pinion 42 and a rack 43 to adjust the position of the signal selecting means 11 in the θ-direction relative to the X-slider 45. The X-slider 45 is supported by a guide rail 46 for movement in the X-direction relative to a Y-slider 50. The movement of the X-slider 45 in the X-direction is provided by a pulse motor 49 supported by the Y-slider 50. That is, the output of the pulse motor 49 is transmitted to the X-slider 45 by way of a pinion 47 and a rack 48, whereby the position of the signal selecting means 11 in the X-direction relative to the Y-slider 50 is adjusted. The Y-slider 50 is supported by a guide 51 for movement in the Y-direction relative to a base 55. The movement of the Y-slider 50 in the Y-direction is provided by a pulse motor 54 supported by the base 55. That is, the output of the pulse motor 54 is transmitted to the Y-slider 50 by way of a pinion 52 and a rack 53, whereby the position of the signal selecting means 11 in the Y-direction relative to the base 55 is adjusted.

Figure 5:
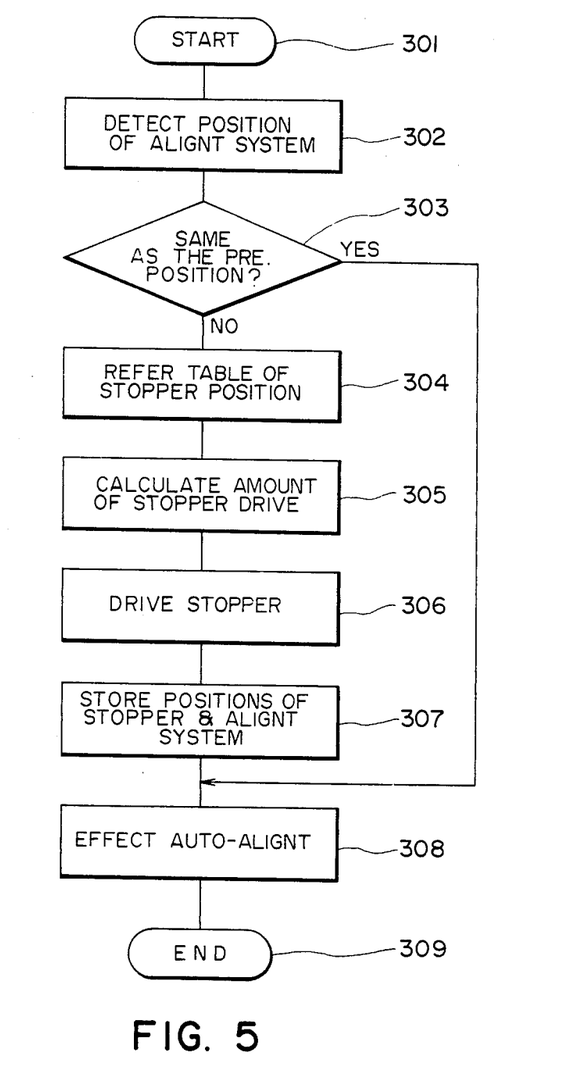
FIG. 5 is a flow chart of an alignment operation in an alignment device according to the embodiment of the present invention a shown in FIG. 2.

FIG. 5 shows the flow of automatic position correcting operations for the optical signal selecting means in this embodiment of the present invention. Hereinafter, the optical signal selecting means in this embodiment will be referred to as a "stopper". The automatic position correcting operation is controlled by the controller 15 shown in FIG. 2. The controller 15 includes a microprocessor, a memory circuit, etc., not shown in the drawings. The memory circuit includes a current-position memory, a preceding-position memory, a stopper position memory and so on.

At Step 301 of FIG. 5, the automatic alignment operation is started. Then, at Step 302, the current position of the alignment optical system is detected. This is achieved by detecting, through the detecting system 14 shown in FIG. 2, the relative position of the optical axes of the projection optical system and the alignment optical system. More specifically, the current position of the alignment optical system has been stored in the current-position memory of the memory circuit as the number of driving pulses of the pulse motor 21 by which the objective lens 5 has been moved to the current position. The origin of the counting of driving pulses, i.e. the origin of movement of the objective lens 5 is defined by one of the photoswitches 30 and 31. Actually, therefore, the data contained in the current-position memory is read out at Step 302 through the microprocessor. Subsequently, at Step 303, discrimination is made on whether or not the current position of the alignment optical system is the same as the position of the alignment optical system which was established during the last of preceding automatic alignment operation (the second-mentioned position hereinafter will be referred to as "the preceding position"). The preceding position has been stored in the preceding-position memory of the memory circuit as the number of the driving pulses of the pulse motor during the preceding automatic alignment operation. Thus, the discrimination is made by comparing the current position of the optical system as detected at the Step 302 with the preceding position of the alignment optical system read out from the preceding-position memory.

If it is detected at Step 303 that the current position of the alignment optical system differs from the preceding position, the sequence proceeds to Step 304 at which the position at which the stopper 11 should be located correspondingly to the current position of the alignment optical system is read out from a table which has been prepared in the memory with the positions of the alignment optical system being written in the address and the corresponding positions of the stopper being written in the data of the memory.

Subsequently, at Step 305, the position of the stopper which has been established during the preceeding automatic alignment operation is read out from the stopper position memory. The position of the stopper as established during the preceding automatic alignment operation has been stored in the stopper position memory in a similar manner as the storing of the data on the position of the alignment optical system, i.e. on the basis of the number of driving pulses of the pulse motors 44, 49 and 54 from the reference initial position of the stopper. Then, at the same Step 305, the preceding stopper position is compared with the designated stopper position which has been read out from the table at the Step 304 and the amount of drive for the stopper 11 is calculated. In accordance with the result of the calculation, the stopper 11 is driven at the Step 306 by appropriate one or ones of the stepping motors 44, 49 and 54. After the drive of the stopper 11 is completed, the position of the stopper 11 at that time is stored in the stopper position memory, while the position of the alignment optical system at the same time is stored in the preceding-position memory (Step 307). These data on the position of the stopper and the position of the alignment optical system are usable in the succeeding automatic alignment operation. The storing of the data on the current position of the alignment optical system into the preceding-position memory is because of a possibility of displacement of the alignment optical system during a time period other than the automatic alignment operation, e.g. for the sake of observation, which displacement results in rewriting of the content of the current-position memory.

After the automatic position adjustment of the stopper 11 is accomplished in the manner as described above, the sequence proceeds to Step 308 whereat the automatic alignment of the reticle 6 and the wafer 8 is effected. If, on the other hand, the result of discrimination at Step 303 shows that the current position of the alignment optical system is the same as the preceding position, the sequence directly proceeds to the Step 308, and the automatic alignment operation is carried out immediately. In any case, the sequence after the Step 308 proceeds to Step 309 at which the automatic alignment is finished.

In the embodiment described in the foregoing, the optical signal selecting means 11 is automatically displaced to a position best suited to the characteristics of telecentricity of the projection lens 7. However, this is not limiting and the optical signal selecting means 11 and the photoelectric converting means 12 may be moved as a unit. Obviously, substantially the same effect is obtainable in such case. Further, the combination of the optical signal selecting means 11 with the photoelectric converting means 12 disclosed in the embodiment may be replaced by a single photoelectric converting means, such as an area sensor, having itself a signal selecting function. Such single photoelectric converting means will be disposed at the same position as the optical signal selecting means 11 in the disclosed embodiment. Also in such case, substantially the same effect is obtainable.

In accordance with the present invention, as has hitherto been described, the optical signal from the wafer alignment mark can always be photoelectrically detected with high accuracies. Therefore, high-accuracy alignment of the reticle and the wafer is assured stably.

While the invention has been described with reference to the structures disclosed herein, it is not confined to the details set forth and this application is intended to cover such modifications or changes as may come within the scope of the following claims.

What is claimed is:

1. An alignment device for aligning a first member with a second member with the aid of a projection optical system for projecting a pattern of the first member onto the second member, said device comprising:

an objective optical system for receiving a light beam from the second member that has passed through the projection optical system;

means for displacing said objective optical system;

filtering means having a filtering portion providing a predetermined filtering action relative to the light beam from the second member that has passed through the projection optical system and has been introduced by said objective optical system to said filtering means; and means for adjusting the position of said filtering portion of said filtering means in accordance with (i) an error of the projection optical system related to a position of incidence, upon said filtering means, of the light beam from said second member and (ii) a position of an optical axis of said objective optical system relative to an optical axis of the projection optical system.

2. A device according to claim 1, wherein said adjusting means adjusts the position of said filtering portion on the basis of a deviation of the position of incidence, upon said filtering means, of the light beam from said second member.

3. An alignment device for aligning a first member with a second member with the aid of a projection optical system for projecting a pattern of the first member onto the second member, said device comprising:
- an objective optical system for receiving a light beam from the second member that has passed through the projection optical system;
- means for displacing said objective optical system;
- filtering means having a filtering portion providing a predetermined filtering action relative to the light beam from the second member that has passed through the projection optical system and has been introduced by said objective optical system to said filtering means; and
- means for adjusting the position of said filtering portion of said filtering means in accordance with (i) an error of the projection optical system related to a position of incidence, upon said filtering means, of the light beam from said second member; and (ii) a positional relation of said objective optical system to the projection optical system;
- wherein said filtering portion of said filtering means is arranged to intercept a portion of the light beam from said second member that is specularly reflected and to transmit a portion of the light beam from said second member that is scatteringly reflected.

4. A device comprising:
- first and second optical means;
- means for changing a positional relation between said first and second optical means;
- filtering means having a filtering portion providing a predetermined filtering action relative to a light beam introduced to said filtering means through said first and second optical means; and
- means for adjusting a position of said filtering portion of said filtering means in accordance with (i) an error of said first optical means related to a position of incidence, upon said filtering means, of the light beam introduced thereto by way of said first and second optical means; and (ii) a positional relation between optical axes of said first and second optical means.

5. A device according to claim 4, wherein said adjusting means adjusts the position of said filtering portion on the basis of a deviation of the position of incidence, upon said filtering means, of the light beam from said second optical means.

* * * * *